(12) United States Patent
Sumimoto

(10) Patent No.: US 6,373,773 B2
(45) Date of Patent: Apr. 16, 2002

(54) SEMICONDUCTOR DEVICE WITH DRAM AND LOGIC PART INTEGRATED

(75) Inventor: Yoshihiko Sumimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/733,270

(22) Filed: Dec. 8, 2000

(30) Foreign Application Priority Data

Jan. 19, 2000 (JP) ........................................ 2000-010903

(51) Int. Cl.[7] ................................................ G11C 7/00
(52) U.S. Cl. .................. 365/226; 365/189.01; 365/227; 365/189.11; 365/189.05
(58) Field of Search ....................... 365/189.01, 189.05, 365/230.01, 189.11, 226, 227

(56) References Cited

U.S. PATENT DOCUMENTS 5,926,396 A * 7/1999 Ohara ........................ 364/490
6,249,145 B1 * 6/2001 Tanake ........................ 326/68
6,298,000 B1 * 10/2001 Kitade et al. ................ 365/222

FOREIGN PATENT DOCUMENTS

JP         409180436 A  *  7/1997

* cited by examiner

*Primary Examiner*—Viet Q. Nguyen
(74) *Attorney, Agent, or Firm*—Merchant & Gould PC

(57) ABSTRACT

An LSI on which a DRAM is mounted together with a logic part, which does not require the level shifter control signal so as to simplify the circuit configuration and reduces power consumption. This LSI includes a level shifter 3 and an interface circuit 5. The level shifter 3 converts the operation voltage level of the DRAM control signal and input data output from the logic part 2 operating with a low voltage power supply, and outputs the DRAM control signal to a DRAM 6. The interface circuit 5 controls the input data output from the level shifter 3 and the output data output from the DRAM 6 by an interface control signal supplied from the DRAM 6, outputs the input data into the DRAM 6 and outputs the output data to the external data output terminal and the logic part.

4 Claims, 8 Drawing Sheets

SEMICONDUCTOR DEVICE WITH DRAM AND LOGIC PART INTEGRATED

BACKGROUND OF THE INVENTION

1. Field of the Invention

The present invention relates to a semiconductor device in which a large capacity memory such as a DRAM (Dynamic Random Access Memory) and a logic IC such as a microcomputer, an ASIC (application specific integrated circuit), etc., are integrated into one chip.

2. Description of the Related Art

In recent years, as a high density and high integration for a semiconductor device have been demanded, a system LSI having a configuration in which a plurality of functional blocks are integrated into one chip has been developed. Recently, in particular, an LSI with embedded memory in which a large capacity memory such as a DRAM is mounted together with a logic IC on one chip has drawn considerable attention.

Furthermore, as power consumption in a semiconductor device has been reduced, accordingly, an LSI is operated with a low voltage power supply. Therefore, a block that cannot be operated with a low voltage power supply is operated by converting a signal with a low voltage operation level into a signal with a high voltage operation level by using a level shifter.

Hereinafter, a system configuration of a conventional DRAM will be described.

FIG. 6 is a diagram showing a system configuration of a conventional DRAM. In a semiconductor device 10, numeral 3 denotes an input level shifter converting a DRAM control signal CL with a low voltage operation level, which is output from the logic part 2, into a signal with a high voltage operation level. The DRAM control signal CH with a high voltage operation level, which is output from the input level shifter 3, controls the DRAM 6.

In the case wherein data is input, data as a signal DIOL with a low voltage operation level is input from an external input/output terminal 34 through a data input/output bus 13 to an input/output level shifter 12 and converted into a signal DIOH with a high voltage operation level in the input/output level shifter 12; the converted signal is input through a data input/output bus 14 to an interface circuit 11; and then the data as a data signal DIH is input from the interface circuit 11 through a data input bus 15 to the DRAM 6.

On the other hand, in the case wherein data is output, data as a data signal DOH is output from the DRAM 6 through a data output bus 16 to the interface circuit 11; is output from the interface circuit 11 as a data signal DIOH through the data input/output bus 14 to the input/output level shifter 12 and converted from the signal DIOH with a high voltage operation level into the signal DIOL with a low voltage operation level in the input/output level shifter 12; and the converted signal is output to the external input/output terminal 34.

FIG. 7 is a diagram showing a configuration of an input level shifter 3 of FIG. 6. When a signal DRAMI with a low voltage operation level is input to a low voltage operation part 20, the high voltage operation part 21 of the next stage outputs the signal DRAMO with a high voltage operation level without changing the logic of the DRAMI.

FIG. 8 is a diagram showing a configuration of an input/output level shifter 12 of FIG. 6. Data input and data output are switched from each other by the level shifter control signal LSC (i.e. WREN, OECF). In this case, when the WREN is in a logic "H" level and the OECF is in a logic "L" level, the level shifter 12 is in a data input state. On the other hand, when the WREN is in a logic "L" level and the OECF is in a logic "H" level, the level shifter 12 is in a data output state.

Based on the above-mentioned flow of the DRAM control signal and data, a write operation and a read-out operation for the DRAM are performed.

However, in the conventional configuration, when the level shifter is used in order to reduce power consumption, the input/output level shifter 12 for converting the input/output signal from the low voltage operation level into the high voltage operation level or from the high voltage operation level into the low voltage operation level is required. The level shifter control signal LSC for selecting input or output is also required. Thus, the conventional circuit becomes complicated.

In addition, in the conventional configuration, both input data and output data are input/output signals. When the input/output signal is used as an input signal and output signal separately, it is necessary additionally to separate the input/output signal into an input signal and an output signal. Thus, another circuit is added.

SUMMARY OF THE INVENTION

It is an object of the present invention to simplify the circuit configuration by omitting an input/output level shifter and a level shifter control signal, and further to reduce power consumption.

Furthermore, it is another object of the present invention to make it easy to select separate I/O and shared I/O of a data input/output specification.

In order to achieve the above-mentioned objects, the present invention provides a semiconductor device in which a DRAM and a logic part are integrated into one chip: including an external input terminal for supplying the logic part with a signal necessary for the logic part to control the DRAM; an external data input terminal for supplying the logic part with input data; an external data output terminal for outputting the output data from the DRAM to the outside; a level shifter converting the operation voltage level of a DRAM control signal and the input data which are output from the logic part, and outputting the DRAM control signal to the DRAM; and an interface circuit controlling the input data output from the level shifter and the output data output from the DRAM by an interface control signal supplied from the DRAM, outputting the input data to the DRAM, and outputting the output data to the external data output terminal and the logic part. The logic part operates with a low voltage power supply.

With such a configuration, since the logic part can be operated at a low voltage by providing the input/output level shifter for both the DRAM control data signal and the input signal, it is possible to reduce the power consumption. Furthermore, since the input/output level shifter and the level shifter control signal for selecting an input data or output data are not required, it is not necessary to control the level shifter, thus simplifying the circuit.

It is preferable in the semiconductor device that the interface circuit includes a bit width changing part for changing the bit width in accordance with the bit width of the logic part by connecting neighboring data lines.

With such a configuration, in a bit width changing part of the interface circuit, neighboring data lines are connected to each other by a mask programmable option. Thus, the number of data lines can be reduced to ½ of the original number. Furthermore, four neighboring data lines are connected to each other by a mask programmable option, thus reducing the number of data lines to ¼ of the original number easily. Furthermore, by changing the configuration of the bit width changing part of the interface circuit, the number of data lines can be reduced further. Therefore, it is possible to realize a semiconductor device in which the bit width of the DRAM access can be changed easily in accordance with the bit width of the logic part.

Furthermore, it is preferable that the interface circuit includes a low voltage operation part for converting the output data signal from the DRAM into a signal with a low voltage operation level.

With such a configuration, in addition to the input/output level shifter, a data output low voltage operation part is provided on the interface circuit, and it is possible to reduce the consumption power by operating tri-state inverters with a low voltage power supply.

Furthermore, it is preferable that the interface circuit is programmable to select any one of separate I/O and I/O sharing for data input and data output.

With such a configuration, it is possible to realize easily a DRAM with separate I/O and shared I/O of data line. When the data line is in shared I/O state, the number of data lines can be reduced to ½ as compared with the case of separate I/O.

DETAILED DESCRIPTION OF THE INVENTION

Hereinafter, the present invention will be described by way of embodiments with reference to drawings.
First Embodiment FIG. 1 is a block diagram showing a configuration of a semiconductor device in a first embodiment according to the present invention; and FIG. 2 is a block diagram showing a basic configuration of an interface circuit of the semiconductor device shown in FIG. 1.

Figure 1:
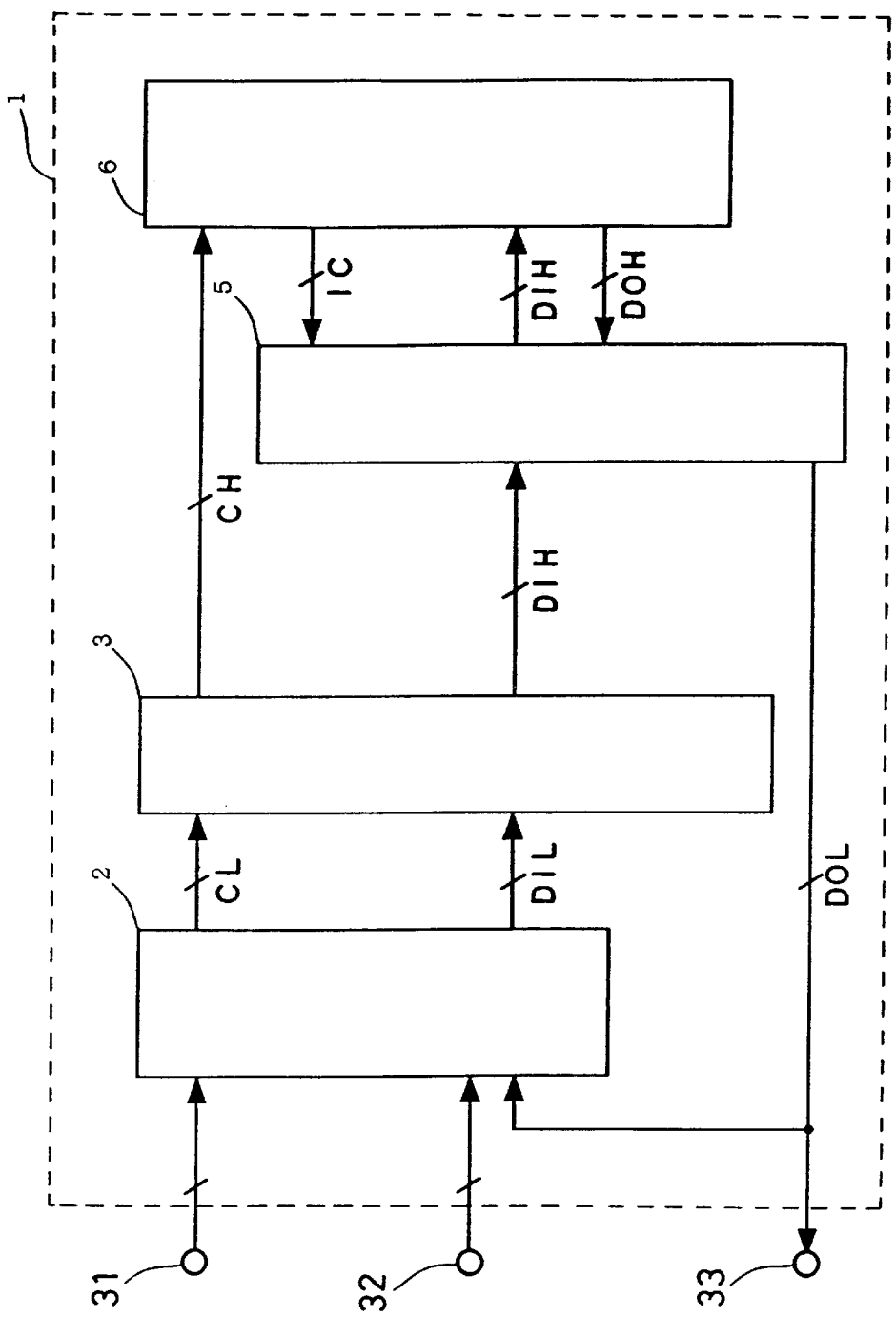
FIG. 1 is a block diagram showing a configuration of a semiconductor device in a first embodiment according to the present invention.

In FIG. 1, numeral 1 denotes a semiconductor device according to the first embodiment, 2 denotes a logic part, 3 denotes an input level shifter, 5 denotes an interface circuit, and 6 denotes a DRAM. The input level shifter 3 converts a DRAM control signal with a low voltage operation level and input data, which are input respectively from an external input terminal 31 and an external data input terminal 32 via the logic part 2, into a signal with a high voltage operation level. The interface circuit 5 sends/receives the data to/from the DRAM 6 and outputs the data to the external data output terminal 33.

Figure 2:
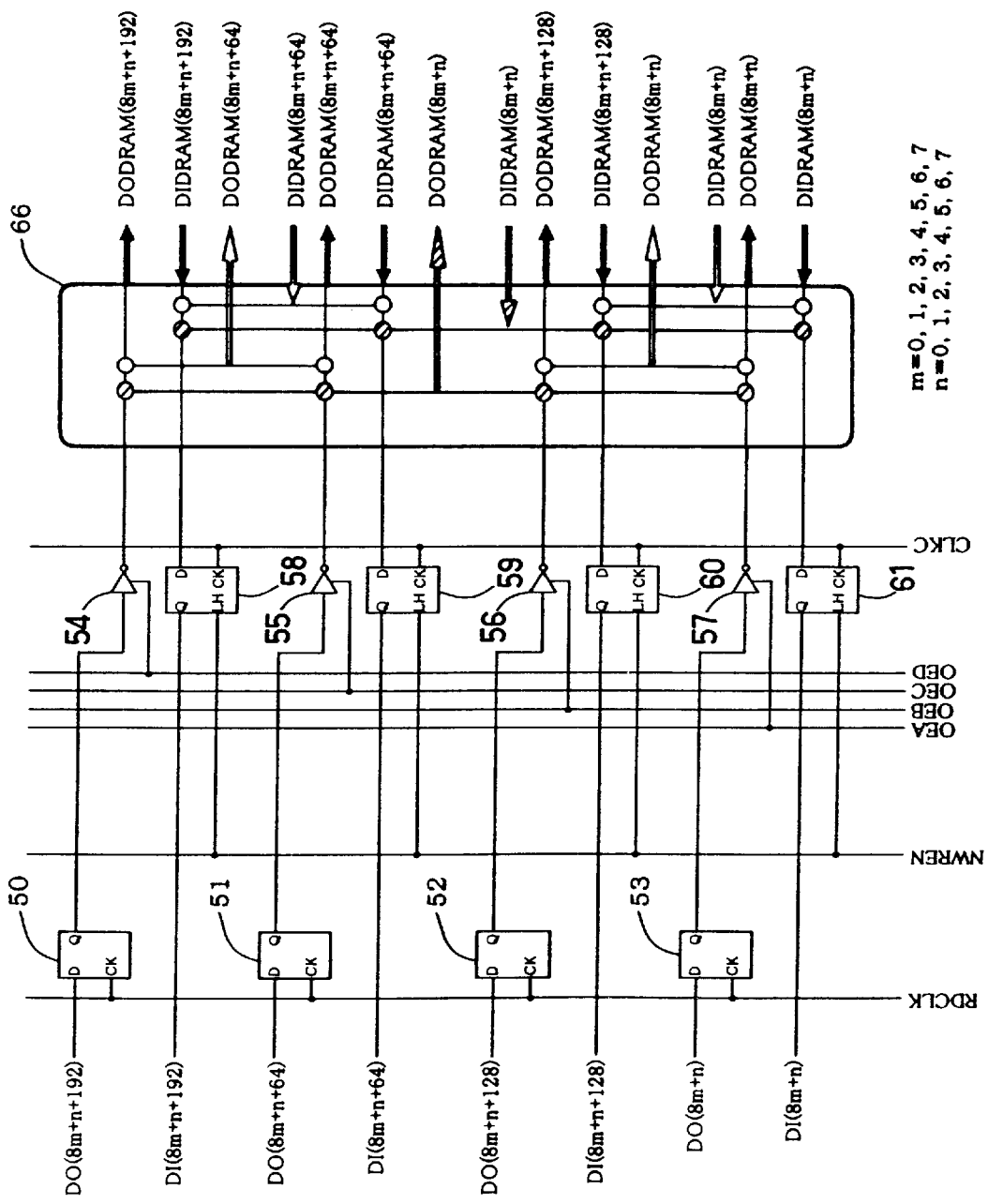
FIG. 2 is a block diagram showing a basic configuration of an interface circuit of the semiconductor device shown in FIG. 1.

Referring to FIG. 2, in the interface circuit 5, numerals 50, 51, 52 and 53 denote D-type flip-flops (hereinafter, DFFs will be referred to) for latching the data from the DRAM 6 at the time of data read-out operation from the DRAM 6. Numerals 54, 55, 56 and 57 respectively denote a tri-state inverter controlled by an output enabling signal OED, OEC, OEB and OEA of the interface control signal IC, and inverting the output signals from the DFFs 50, 51, 52 and 53 so as to output. Numerals 58, 59, 60 and 61 respectively denote DFF controlled by a write enabling signal NWREN of the interface control signal IC from the DRAM 6, and handing the data to the DRAM 6 at the time of data write operation to the DRAM 6. Numeral 66 denotes a bit width changing part constructed so that the bit width can be changed in accordance with the bit width of the logic part 2 by a mask programmable option.

Next, the operation of the semiconductor device having the above-mentioned configuration will be described with reference to FIGS. 1 and 2.

Referring to FIG. 1, in order to achieve low power consumption for the semiconductor device, a signal with a low voltage operation level is input from the external data input terminal 31 and the external data input terminal 32 into the logic part 2. The logic part 2 is operated at low voltage, and outputs the DRAM control signal CL with a low voltage operation level (RAS, CAS, WE, OE, etc.). The output DRAM control signal CL is converted from a signal with a low voltage operation level into a signal with a high voltage operation level CH in the input level shifter 3 and input into the DRAM 6.

Similarly, the data at the time of write operation is input from the external data input terminal 32 to the logic part 2 as a signal with a low voltage operation level, and output from the logic part 2 as the data DIL with a low voltage operation level. The output data signal DIL is converted from the data signal DIL with a low voltage operation level into a data signal DIH with a high voltage operation level in the input level shifter 3, and input into the interface circuit 5.

Referring to FIG. 2, for example, in the case of the 256 bit width access at the time of write operation, the data DIH input to the interface circuit 5 is latched by an internal clock allowing the DRAM 6 to operate (hereinafter, CLKC will be referred to) in the DFFs 61, 60, 59 and 58, each connected respectively to the data lines DIDRAM (8m+n), DIDRAM (8m+n+128), DIDRAM (8 m+n+64) and DIDRAM (8m+n+192) (m, n=0, 1, 2, 3, 4, 5, 6 and 7); load/hold controlled by a /write enabling signal of interface control signal IC from the DRAM 6 (hereinafter, NWREN will be referred to); and write operation to the DRAM 6 from the data lines DI (8m+n), DI(8m+n+128), DI (8m+n+64) and DI (8m+n+192) are performed.

On the other hand, at the time of read-out operation, the data DOH is read out from the DRAM 6 to the data lines DO (8m+n), DO (8m+n+128), DO (8m+n+64) and DO (8m+n+192); latched by a read-out clock of the interface control signal IC from the DRAM 6 (hereinafter, RDCLK will be referred to) respectively in the DFFs 53, 52, 51 and 50; output controlled by the output enabling signal (hereinafter, OEA, OEB, OEC and OED will be referred to) of the interface control signal IC from the DRAM 6 in the tri-state inverters 57, 56, 55 and 54; read out as a data signal DOL from the data lines DODRAM (8m+n), DODRAM (8m+n+128), DODRAM (8m+n+64) and DODRAM (8m+n+192); and output to the external data output terminal or the logic part 2.

As mentioned above, by providing the input/output level shifter 3, the logic part 2 can be operated at low voltage. Therefore, the power consumption for an entire device can be reduced.

Herein, for example, when the 128 bit width access is desired, by connecting the neighboring data lines such as DIDRAM (8m+n) and DIDRAM (8m+n+128), DIDRAM (8m+n+64) and DIDRAM (8m+n+192), DODRAM (8m+n) and DODRAM (8m+n+128), and DODRAM (8m+n+64) and DIDRAM (8m+n+192) by a mask programmable option in the bit width changing part 66, the bit width can be changed easily.

Furthermore, when the 64 bit width access is desired, by connecting the data lines such as DIDRAM (8m+n), DIDRAM (8m+n+128), DIDRAM (8m+n+64) and DIDRAM (8m+n+192), DODRAM (8m+n), DODRAM (8m+n+128), DODRAM (8m+n+64) and DODRAM (8m+n+192) by a mask programmable option, the bit width can be changed easily.

Moreover, in this embodiment, the 64 bit width access, the 128 bit width access and the 256 bit width access are described as an examples. However, the bit width access is not necessarily limited to them and other bit width access can be employed by changing the configuration of the bit width changing part 66 of the interface circuit 5.

Therefore, by providing the semiconductor device 1 with the input level shifter 3, the semiconductor device capable of reducing the power consumption as well as capable of easily changing the access bit width of the DRAM in accordance with the bit width of the logic part 2 by a construction so that the neighboring data lines can be connected with each other by a mask programmable option in the bit width changing part 66 of the interface circuit 5 can be realized.

Second Embodiment

Figure 3:
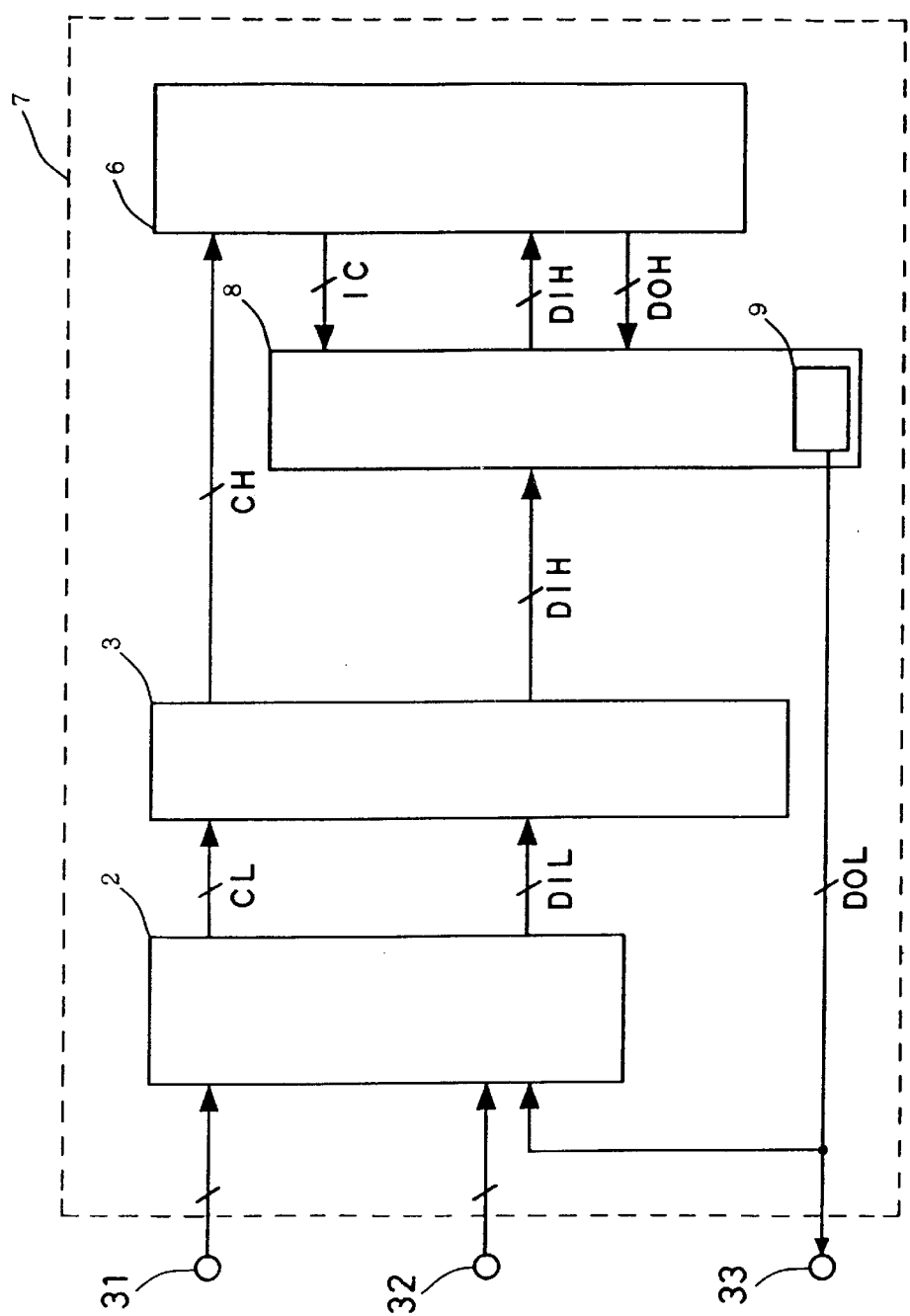
FIG. 3 is a block diagram showing a configuration of a semiconductor device in a second embodiment according to the present invention.
Figure 4:
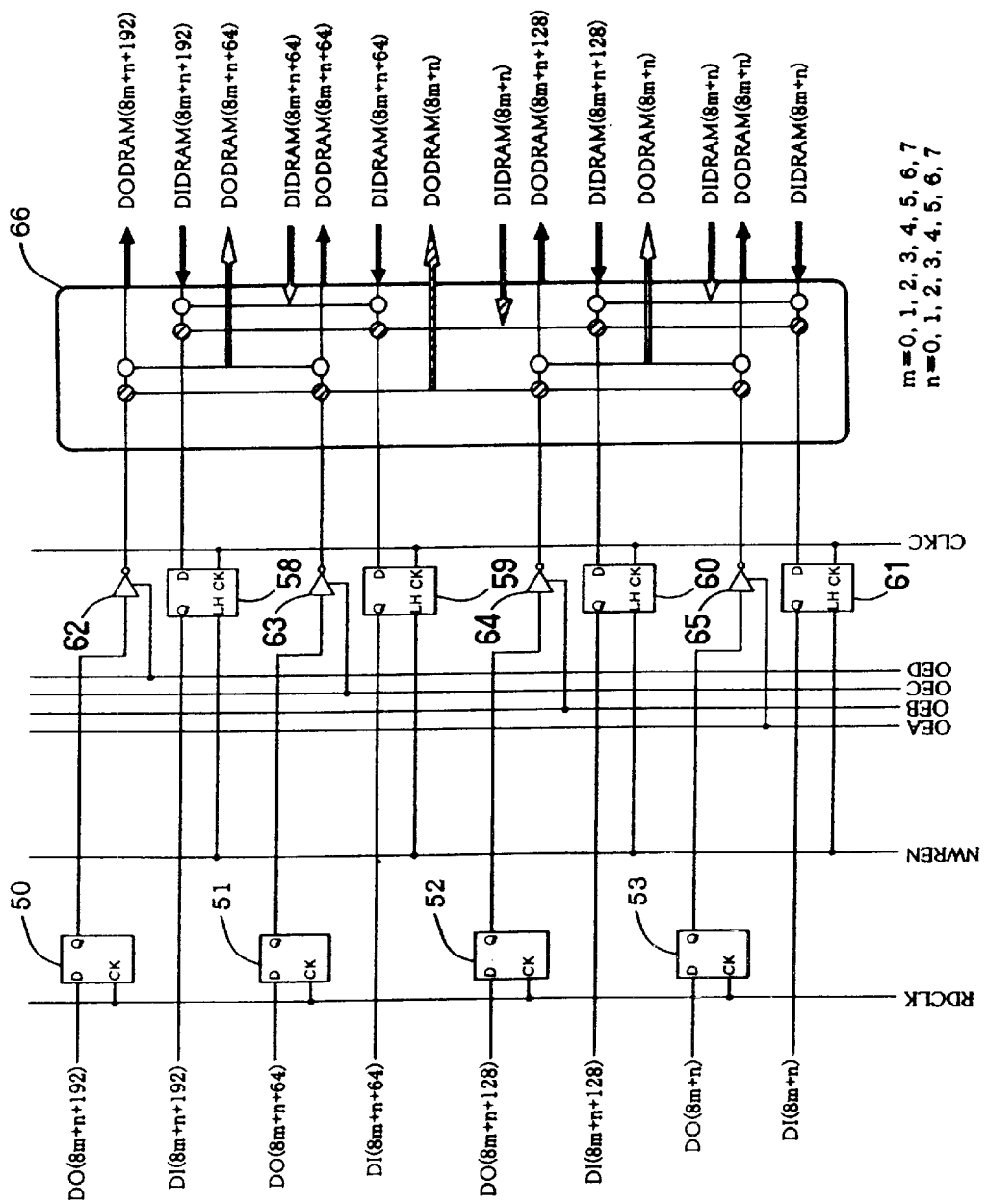
FIG. 4 is a block diagram showing a basic configuration of an interface circuit of the semiconductor device shown in FIG. 3.

FIG. 3 is a block diagram showing a configuration of a semiconductor device in a second embodiment according to the present invention. FIG. 4 is a block diagram showing a basic configuration of the interface circuit of the semiconductor device shown in FIG. 3.

In FIGS. 3 and 4, to the parts having the same configurations as in FIGS. 1 and 2, the same numbers are given and detailed explanations thereof are not repeated herein.

Referring to FIG. 3, numeral 7 denotes a semiconductor device according to the second embodiment. Numeral 8 denotes an interface circuit that sends/receives data to/from the DRAM 6 and outputs the data into the external data output terminal 33. Numeral 9 denotes a data output low voltage operation part provided inside the interface circuit 8.

Referring to FIG. 4, numerals 62, 63, 64 and 65 denote tri-state inverters operating with a low voltage power supply.

Next, the operation of the semiconductor device 7 having the above-mentioned configuration will be described with reference to FIGS. 3 and 4. Since the operation of the DRAM control signal and the operation at writing are the same as in First Embodiment, explanations thereof are not repeated herein.

At the time of the read out operation, the data is read out from the DRAM 6 to the data lines of FIG. 4, i.e., DO (8m+n), DO (8m+n+128), DO (8m+n+64), and DO (8m+n+192); each read out data is latched by the RDCLK of the interface control signal IC from the DRAM 6 in the DFFs 53, 52, 51 and 50; and the data signals are converted into the data signal with a low voltage operation level in the tri-state inverters 65, 64, 63 and 62.

The data signals converted into the low voltage operation level are output controlled by the interface control signals OEA, OEB, OEC and OED from the DRAM 6; read out to the data lines DODRAM (8m+n), DODRAM (8m+n+128), DODRAM (8m+n+64) and DODRAM (8m+n+192); and output to the external data output terminal 33 or the logic part 2.

As mentioned above, by providing the input level shifter 3 and further operating the tri-state inverters 62, 63, 64 and 65 with a low voltage power supply in the interface circuit 11, power consumption can be reduced further compared with First Embodiment. Moreover, the method of mask programmable option for the bit width in the bit width changing part 66 is the same as in First Embodiment.

Therefore, by constructing the semiconductor device 7 by incorporating the input level shifter 3 and the data output low voltage operation level part 9 into the interface circuit 8, the power consumption can be reduced further as compared with First Embodiment. Furthermore, by constructing the semiconductor device so that the neighboring data lines can be connected with each other by a mask programmable option in the bit width changing part 66 of the interface circuit 8, the semiconductor device capable of easily changing the bit width of the DRAM access in accordance with the bit width of the logic part 2 can be realized.

Third Embodiment

Figure 5:
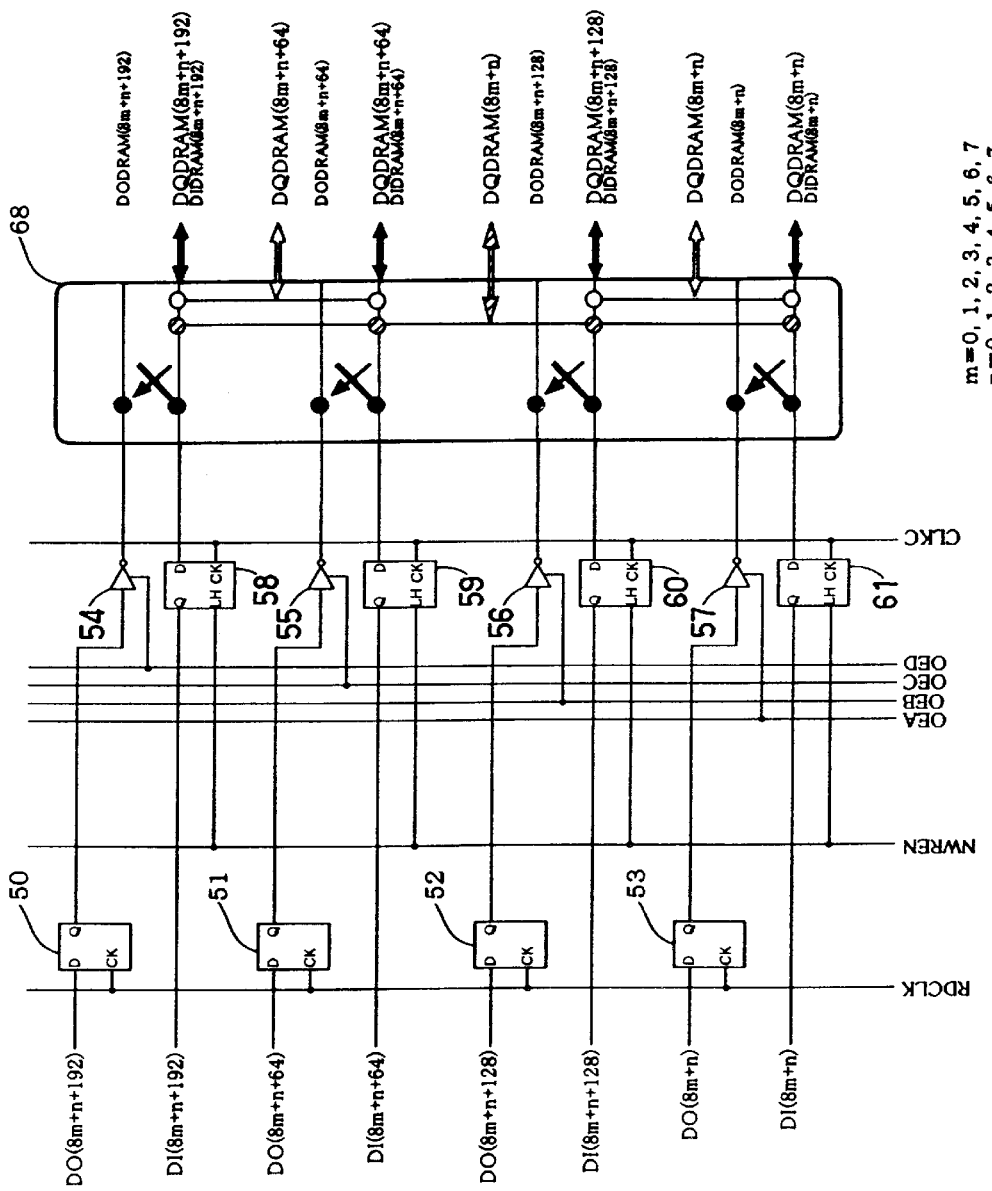
FIG. 5 is a block diagram showing a basic configuration of an interface circuit in a third embodiment according to the present invention.
Figure 6:
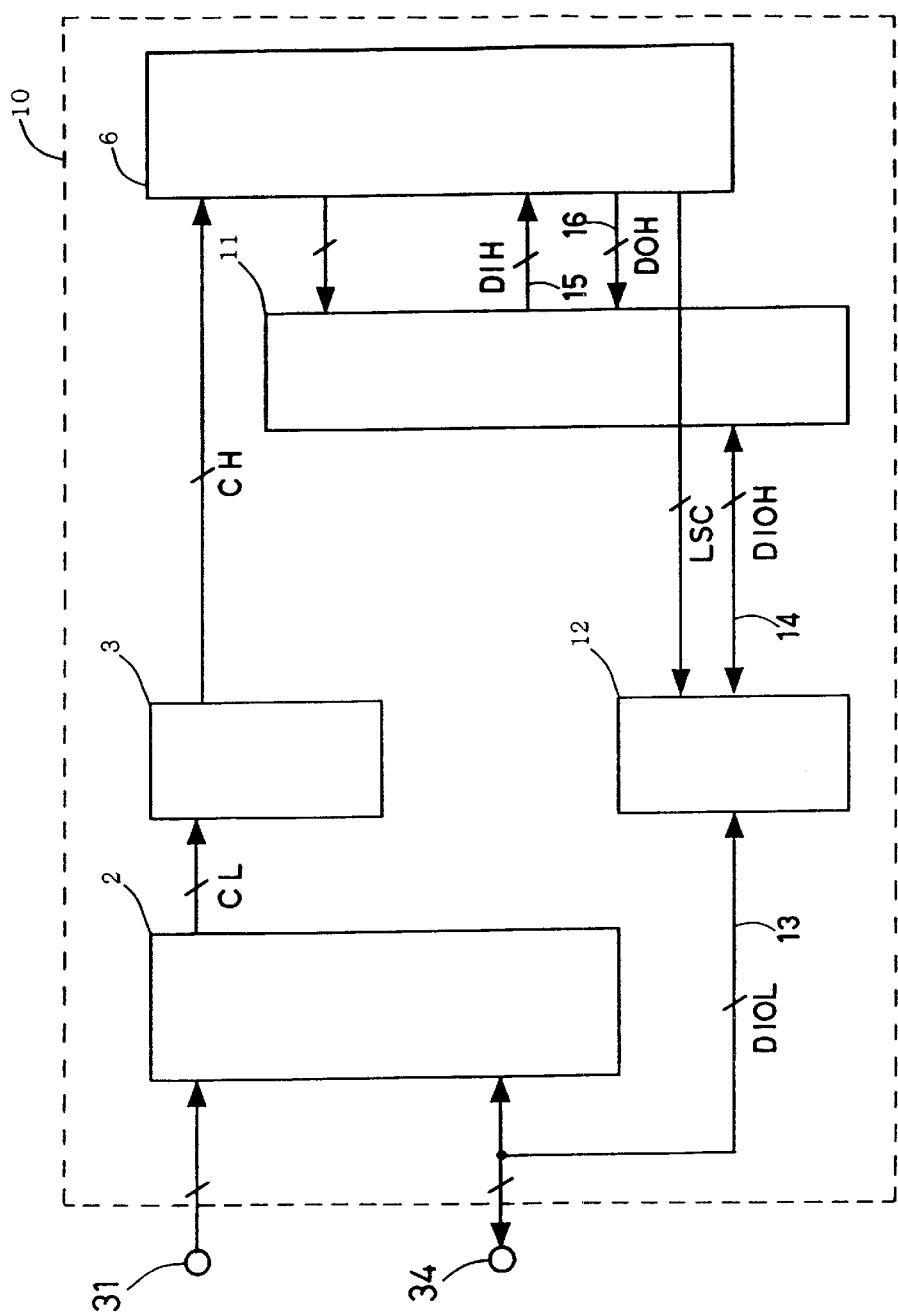
FIG. 6 is a block diagram showing a configuration of a conventional semiconductor device.
Figure 7:
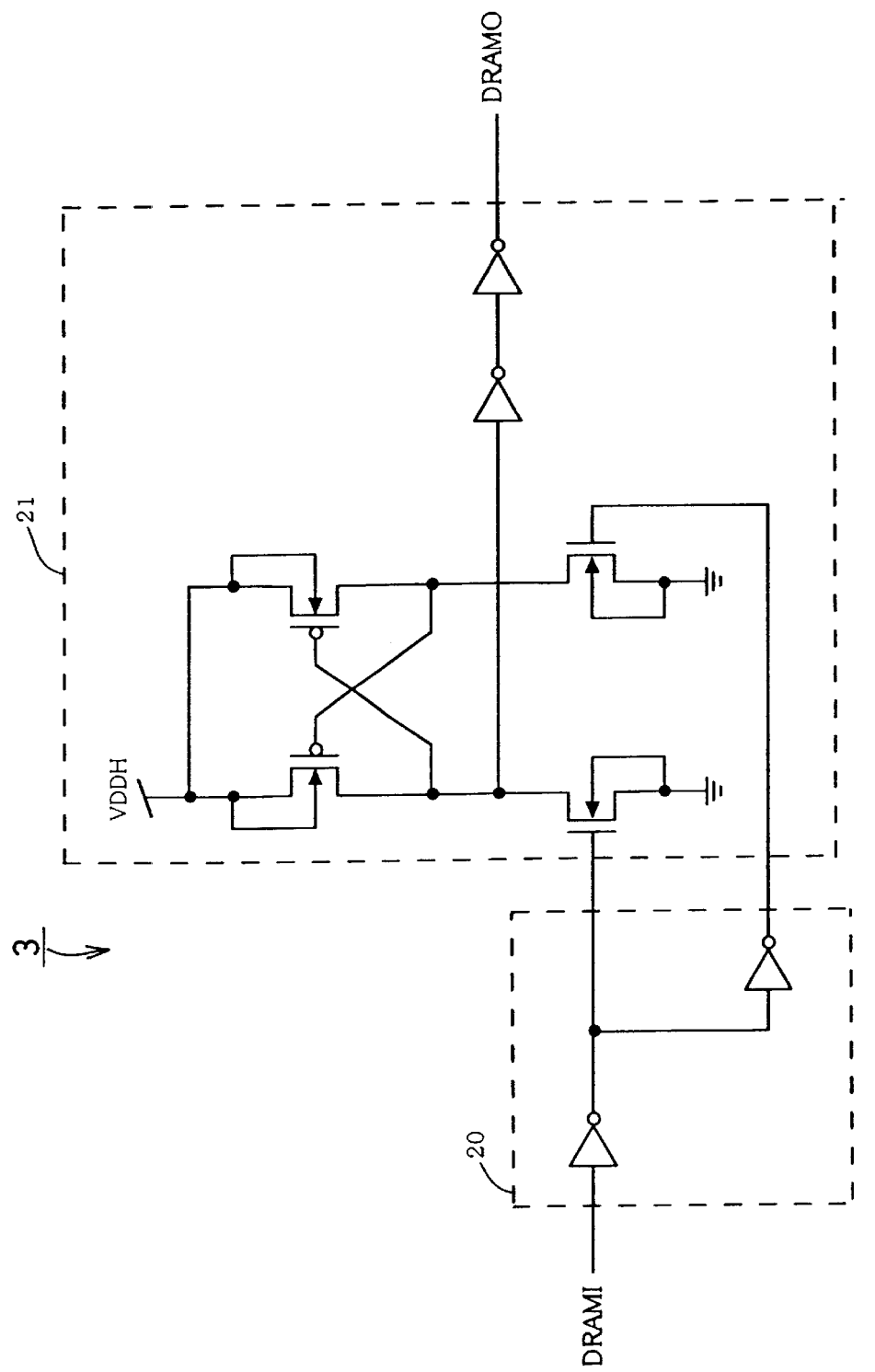
FIG. 7 is a block diagram showing a configuration of an input level shifter of FIG. 6.
Figure 8:
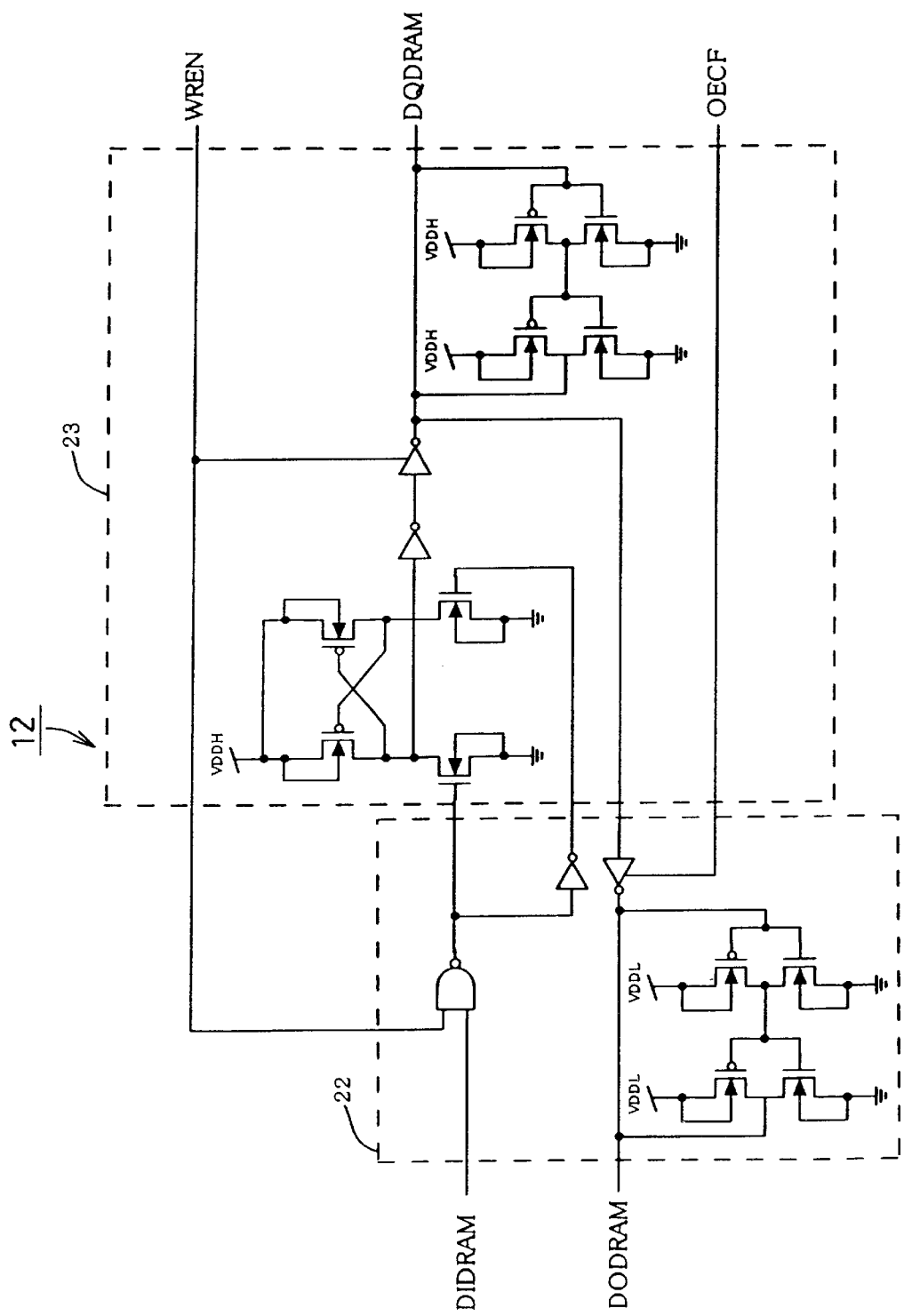
FIG. 8 is a block diagram showing a configuration of an input/output level shifter of FIG. 6.

FIG. 5 is a block diagram showing a basic configuration of an interface circuit in a third embodiment according to the present invention.

In FIG. 5, the parts having the same configurations as in FIG. 2 are given, the same numbers and detailed explanations are not repeated herein.

Referring to FIG. 5, numeral 68 denotes a bit width changing part capable of changing the bit width by a mask programmable option in accordance with the bit width of the logic part 2 and having a configuration so that shared I/O and separate I/O for the data can be selected.

The operation of the basic block of the interface circuit will be described with reference to FIG. 5. The DRAM control signal has the same configuration as in First Embodiment, and the explanation is not repeated herein. This explanation is the case where the shared I/O for the data is selected by a mask programmable option. The data lines in the case of separate I/O, DIDRAM (8m+n), DIDRAM (8m+n+128), DIDRAM (8m+n+64) and DIDRAM (8m+n+192), respectively correspond to data lines DQDRAM (8m+n), DQDRAM (8m+n+128), DQDRAM (8m+n+64) and DQDRAM (8m+n+192).

At the time of write operation, the data is supplied from the data lines DQDRAM (8m+n), DQDRAM (8m+n+128), DQDRAM (8m+n+64) and DQDRAM (8m+n+192) to the DFFs 61, 60, 59 and 58; latched by the CLKC; load/hold controlled by the interface control signal NWREN from the DRAM 6; and written from the data lines DI (8m+n), DI (8m+n+128), DI (8m+n+64) and DI (8m+n+192) into the DRAM 6.

At this time, the output from the tri-state inverters 57, 56, 55 and 54 is stopped by the interface control signals OEA, OEB, OEC and OED from the DRAM 6. Therefore, no conflict of data occurs.

On the other hand, at the time of read-out operation, the data is read out from the DRAM 6 to the data lines DO (8m+n), DO (8m+n+128), DO (8m+n+64), DO (8m+n+

192); latched by the interface control signal RDCLK from the DRAM 6 in the DFFs 53, 52, 51 and 50; output controlled by the interface control signals OEA, OEB, OEC and OED from the DRAM 6 at tri-state inverters 57, 56, 55 and 54; and read out to the data lines DQDRAM (8m+n), DQDRAM (8m+n+128), DQDRAM (8m+n+64) and DQDRAM (8m+n+192).

At this time, since the DFFs 61, 60, 59 and 58 are controlled to be in a hold state by the interface control signal NEWREN, no conflict of data occurs.

Therefore, the data lines are setting the shared I/O by a mask programmable option. As compared with the case of the separate I/O, it is possible to reduce the number of the data lines by half.

Herein, for example, when the 128 bit width access is desired, in the bit width changing part 68, by connecting the neighboring data lines such as DQDRAM (8m+n) and DQDRAM (8m+n+128), DQDRAM (8m+n+64) and DQDRAM (8m+n+192) by a mask programmable option, the bit width can be changed easily. Furthermore, when the 64 bit width access is desired, by connecting the neighboring data lines such as DQDRAM (8m+n), DQDRAM (8m+n+128), DQDRAM (8m+n+64) and DQDRAM (8m+n+192) by a mask programmable option, the bit width can be changed easily.

In this embodiment, the 64 bit width access, the 128 bit width access and the 256 bit width access are described as examples. However, the bit width access is not necessarily limited to them and other bit width access can be employed by changing the configuration of bit width changing part of the interface circuit.

Furthermore, the same is true in the case of the data lines of the separate I/O, DODRAM (8m+n), DODRAM (8m+n+128), DODRAM (8m+n+64), DODRAM (8m+n+192) respectively correspond to data lines DQDRAM (8m+n), DQDRAM (8m+n+128), DQDRAM (8m+n+64) and DQDRAM (8m+n+192).

Therefore, it is possible to change the separate I/O and shared I/O easily by a mask programmable option and, in the case of shared I/O, to reduce the number of data lines to the logic part. Furthermore, it is possible to obtain a semiconductor device capable of easily changing the bit width of the DRAM access in accordance with the bit width of the logic part by constructing the device so that the interface circuit is provided with the bit width changing part and the neighboring data lines are connected by a mask programmable option.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A semiconductor device in which a DRAM and a logic part are integrated into one chip: comprising an external input terminal for supplying the logic part with a signal necessary for the logic part to control the DRAM;

an external data input terminal for supplying the logic part with input data;

an external data output terminal for outputting the output data from the DRAM to the outside;

a level shifter converting the operation voltage level of a DRAM control signal and the input data which are output from the logic part, and outputting the DRAM control signal to the DRAM, and an interface circuit controlling the input data output from the level shifter and the output data output from the DRAM by an interface control signal supplied from the DRAM, outputting the input data to the DRAM, and outputting the output data to the external data output terminal and the logic part;

wherein the logic part operates with a low voltage power supply.

2. The semiconductor device according to claim 1, wherein the interface circuit comprises a bit width changing part for changing the bit width in accordance with the bit width of the logic part by connecting neighboring data lines.

3. The semiconductor device according to claim 1, wherein the interface circuit comprises a low voltage operation part converting the output data signal from the DRAM into a signal with a low voltage operation level.

4. The semiconductor device according to claim 1, wherein the interface circuit is programmable to select any one of separate I/O and shared I/O for data input and data output.

* * * * *